US012761262B2

(12) United States Patent
Cartron

(10) Patent No.: US 12,761,262 B2
(45) Date of Patent: Oct. 13, 2026

(54) METHOD AND DEVICE FOR ANALYZING DEFECTS BY MEANS OF REFLECTOMETRY USING A TRANSFER FUNCTION ESTIMATION

(71) Applicant: COMMISSARIAT A L'ENERGIE ATOMIQUE ET AUX ENERGIES ALTERNATIVES, Paris (FR)

(72) Inventor: Mickaël Cartron, Gif-sur-Yvette (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 108 days.

(21) Appl. No.: 18/846,605

(22) PCT Filed: Apr. 7, 2023

(86) PCT No.: PCT/EP2023/059324
§ 371 (c)(1),
(2) Date: Sep. 12, 2024

(87) PCT Pub. No.: WO2023/198647
PCT Pub. Date: Oct. 19, 2023

(65) Prior Publication Data

US 2025/0199051 A1 Jun. 19, 2025

(30) Foreign Application Priority Data

Apr. 12, 2022 (FR) ....................................... 2203383

(51) Int. Cl.
*G01R 31/11* (2006.01)
*G01R 31/08* (2020.01)

(52) U.S. Cl.
CPC ............ *G01R 31/11* (2013.01); *G01R 31/085* (2013.01)

(58) Field of Classification Search
CPC ............................... G01R 31/11; G01R 31/085
See application file for complete search history.

(56) References Cited

U.S. PATENT DOCUMENTS

| | | | | |
|---|---|---|---|---|
| 9,250,285 B2 * | 2/2016 | Millet | G01R 31/11 | |
| 12,487,268 B2 * | 12/2025 | Wu | G01R 31/11 | |
| 2005/0052190 A1 * | 3/2005 | McCosh | G01B 11/024 | 324/644 |
| 2018/0059164 A1 | 3/2018 | Cohen et al. | | |
| 2019/0178929 A1 | 6/2019 | Ha et al. | | |
| 2020/0166560 A1 | 5/2020 | Layer et al. | | |
| 2020/0200814 A1 | 6/2020 | Layer et al. | | |

FOREIGN PATENT DOCUMENTS

FR 2 926 141 A1 7/2009

* cited by examiner

*Primary Examiner* — Reena Aurora
(74) *Attorney, Agent, or Firm* — Baker Hostetler

(57) ABSTRACT

A method and a device for analyzing defects by means of reflectometry which are based on estimating a transfer function at a frequency resolution which is larger than that normally allowed by taking account of the limitations which are intrinsic to analog-to-digital and digital-to-analog converters and notably of their sampling frequencies.

20 Claims, 3 Drawing Sheets

METHOD AND DEVICE FOR ANALYZING DEFECTS BY MEANS OF REFLECTOMETRY USING A TRANSFER FUNCTION ESTIMATION

CROSS-REFERENCE TO RELATED APPLICATIONS

This application is a National Stage of International patent application PCT/EP2023/059324, filed on Apr. 7, 2023, which claims priority to foreign French patent application No. FR 2203383, filed on Apr. 12, 2022, the disclosures of which are incorporated by reference in their entireties.

FIELD OF THE INVENTION

The invention relates to the field of analyzing defects impacting transmission lines, such as electric cables. The invention relates to the particular field of reflectometry, notably applied to wire diagnostics, which encompasses the field of detecting, locating and characterizing defects in single transmission lines or complex wired networks. More generally, the invention also applies to any technical field in which a reflectometry method is implemented in order to characterize the environment through which the signal propagates. In particular, the invention applies to the fields of radar, lidar and sonar, but also to non-destructive testing by means of acoustic or electrical waves.

BACKGROUND

The invention bears on a method and a device for analyzing defects by means of reflectometry which are based on estimating a transfer function at a frequency resolution which is larger than that normally allowed by taking account of the limitations which are intrinsic to analog-to-digital and digital-to-analog converters and notably of their sampling frequencies.

Cables are ubiquitous in all electric systems, for supplying power or transmitting information. These cables are subjected to the same stresses as the systems which they connect and may be subject to failures. It is therefore necessary to be able to analyze their state and to provide information on the detection of defects, but also their location and their type, in order to assist with maintenance.

Ordinary reflectometry methods make this type of test possible. They use test or reference signals, also called probe signals or reflectometry signals. The form of these signals changes significantly when they propagate out and back through a cable, these changes being the consequence of the physical phenomena of attenuation and dispersion.

Known reflectometry methods operate according to the following method. A controlled reference signal, for example a periodic pulsed signal or indeed a multi-carrier signal, is injected at one end of the cable to be tested. More generally, in modern reflectometry methods, the reference signal used is chosen in accordance with its autocorrelation properties, that is to say that the signal correlated with itself must produce a result which is as close as possible to a Dirac comb. The signal propagates along the cable and reflects off the singularities which it comprises.

A singularity in a cable corresponds to a modification of the conditions in which the signal propagates through this cable. It results most often from a defect which locally modifies the characteristic impedance of the cable by causing a discontinuity in its linear electrical parameters.

The reflected signal is backpropagated as far as the point of injection, then is analyzed by the reflectometry system. The delay between the injected signal and the reflected signal makes it possible to locate one or more singularities, corresponding to an electrical defect, in the cable. A defect may result from a short circuit, from an open circuit or indeed from a local degradation of the cable or even from a mere pinching of the cable.

Reflectometry methods use a principle which is close to that of radar: an electrical signal, the probe signal, which is often high-frequency or wideband, is injected in one or more places on the cable or on the network of cables to be tested. The signal propagates through the cable or the network and sends back some of its power when it encounters an electrical discontinuity. An electrical discontinuity may result, for example, from a branch, from the end of the cable or from an electrical defect in any place on the cable. Analyzing the signals sent back to the point of injection makes it possible to deduce therefrom information on the presence and the location of these discontinuities, and therefore of the possible defects. An analysis in the time or frequency domain is usually carried out. These methods are designated by the acronyms TDR, for "time-domain reflectometry", and FDR, for "frequency-domain reflectometry". In particular, TDR methods analyze the measured signal by computing the intercorrelation between this measured signal and the injected signal for several time values. The result of this computation is called a time-domain reflectogram. Analyzing the amplitude peaks of the reflectogram makes it possible to characterize the presence and the position of possible defects in the cable.

A reflectometry system in general uses a digital-to-analog converter to convert the generated digital test signal into an analog signal to be injected into the cable being tested and an analog-to-digital converter to convert the measured reflected signal into a digital signal.

These two components each operate at a given sampling frequency which is limited by the technology of these components.

However, in the field of time-domain reflectometry, in order to characterize as accurately as possible the signatures of the potential defects which are present on the network of cables to be analyzed, it is necessary to obtain the best time resolution possible while at the same time respecting the constraints of the sampling frequencies in transmitting and receiving mode.

In order to improve the time and therefore spatial resolution in time-domain reflectometry, several solutions are envisaged in the prior art.

In relation to acquiring the test signal backpropagated through the cable, by using a periodic signal, it is possible to carry out measurements with a high level of oversampling by means of oversampling techniques such as those described in the patent publications FR1755478 and FR2926141 by the Applicant.

The oversampling technique described in FR2926141 is based on several measurements of the signal at a low sampling frequency but while phase-shifting, for each measurement, the clock of the analog-to-digital converter by a duration which is smaller than the sampling period.

The oversampling technique described in FR1755478 is based on an analog-to-digital converter clock operating at a specific frequency which produces sampling instants which, once put in the right order, constitute a measurement which is equivalent to that which would be carried out with a higher sampling frequency.

There are, therefore, oversampling techniques for increasing the time resolution of the measured signal without increasing the sampling frequency of the analog-to-digital converter.

However, in relation to the injection of the test signal into the cable, the aforementioned techniques are not applicable and the time resolution of the generated test signal is limited by the sampling frequency of the digital-to-analog converter.

Thus, it is not possible to inject, into the cable to be analyzed, a test signal composed of pulses the time width of which is smaller than the sampling period of the digital-to-analog converter, in other words pulses of very short durations. This leads to a limitation on the spatial resolution of the defects which it is possible to analyze, for example of the superficial defects which generate a singularity the time signature of which in the reflectogram would have a duration which is smaller than the sampling period.

In order to improve the time resolution at the level of injecting the test signal, a first approach consists in increasing the sampling frequency of the digital-to-analog converter; however, this has the drawback of greater complexity for this component and for the other components which interface with it.

Another approach consists in using several digital-to-analog converters operating in parallel with clocks which are phase-shifted in a balanced fashion. All the outputs of the converters are summed by means of a summing mixer. The resulting signal has a higher apparent sampling frequency; on the other hand, the dynamic range of this signal is very much altered during the process in comparison with the native dynamic range of the digital-to-analog converter. Furthermore, the presence of the summing mixer leads to additional complexity in the analog portion of the device, which may lead to additional analog defects.

There is therefore no satisfactory solution for improving the time resolution in transmitting mode in a time-domain reflectometry system.

SUMMARY OF THE INVENTION

The invention proposes a novel time-domain reflectometry method based on estimating the transfer function of the cable or network of cables being tested, the transfer function being estimated at a frequency resolution which is larger than that which is normally compatible with the sampling frequency of the digital-to-analog converter.

Thus the invention makes it possible to more finely characterize the possible defects of the cable with a higher spatial resolution than that which would be obtained with an equivalent system which did not use the invention.

The invention applies to any type of electric cable, in particular power transmission cables, in fixed or mobile installations. The cables concerned may be coaxial, two-wire, parallel-line, twisted-pair or otherwise.

The invention applies more generally to any system implementing a reflectometry method in order to characterize the medium through which the reflectometry signal propagates.

The invention bears on a method for analyzing defects by means of reflectometry in a network of transmission lines into which a first test signal is injected beforehand, the method comprising the steps of:

- acquiring a measurement of the first test signal after it has propagated through the network of lines,
- digitizing the signal measured at a first sampling frequency,
- sampling the first test signal at the first sampling frequency,
- converting the digitized measured signal and the sampled first test signal into the frequency domain,
- determining an estimate of the transfer function of the network by computing the ratio between said signals in the frequency domain,
- generating a second test signal having a second sampling frequency,
- determining the frequencies which are present in the second test signal,
- interpolating the estimated transfer function for the frequencies which are present in the second test signal,
- converting the second test signal into the frequency domain,
- computing the product of the interpolated transfer function and of the second test signal in the frequency domain,
- determining an estimate of a measurement of the second test signal after it has propagated through the network of lines by converting the result of said product into the time domain.

According to one particular aspect of the invention, the first test signal and the second test signal are periodic signals.

According to one particular aspect of the invention, the second test signal is composed of a periodically repeated time pulse having a pulse duration which is smaller than the sampling frequency of the first test signal.

According to one particular aspect of the invention, the measurement of the first test signal is digitized by means of an analog-to-digital converter operating at a sampling frequency which is smaller than the first sampling frequency, the digitized signal at the output of the analog-to-digital converter being oversampled at the first sampling frequency.

According to one particular aspect of the invention, the first test signal is injected into the network of cables with a sampling frequency which is smaller than the first sampling frequency and the method comprises a step of oversampling the first test signal at the first sampling frequency.

According to one particular aspect of the invention, the first 4 steps are iterated for several test signals at various sampling frequencies and the step of interpolating the transfer function is carried out by selecting, for each frequency to be interpolated, one of the test signals according to a predetermined criterion.

According to one particular aspect of the invention, the predetermined criterion consists in selecting the test signal which has the highest amplitude for the frequency to be interpolated.

According to one particular aspect of the invention, the interpolation step is carried out by means of a linear interpolation, on the modulus and on the phase of the signal separately.

Another subject of the invention is a device for analyzing defects by means of reflectometry in a network of transmission lines into which a first test signal is injected beforehand, the device comprising a measuring device and a computing unit which are configured to implement the steps of the method according to the invention.

According to one variant, the device according to the invention furthermore comprises a module for injecting the first test signal into the network of cables comprising a digital-to-analog converter, the measuring device comprising an analog-to-digital converter.

BRIEF DESCRIPTION OF THE DRAWINGS

Other features and advantages of the present invention will become more apparent on reading the following description in relation to the following appended drawings.

DETAILED DESCRIPTION

Figure 1A:
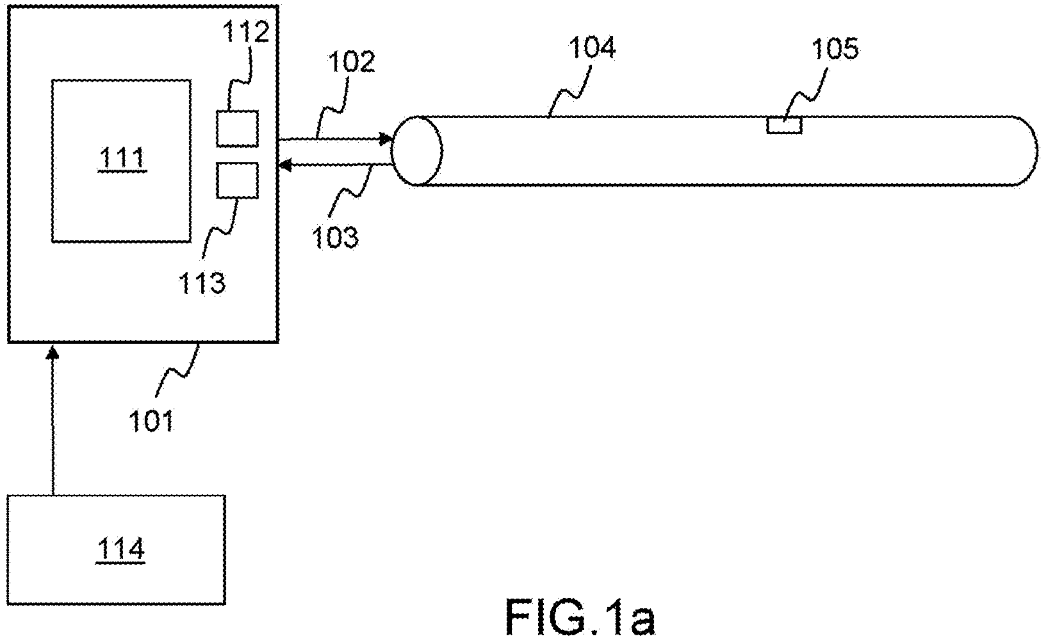
FIG. 1*a* depicts a diagram of a first example of a time-domain reflectometry system.

FIG. 1*a* describes a block diagram of one example of a time-domain reflectometry system. The invention is positioned in the context of reflectometry methods for detecting, locating or characterizing defects impacting a cable or a network of cables.

FIG. 1*a* depicts a cable to be tested 104 which has a defect 105 at any distance from one end of the cable. Without departing from the scope of the invention, the cable 104 may be replaced by a network of interconnected complex cables. The single cable 104 of FIG. 1*a* is depicted for purely illustrative purposes in order to explain the general principle of a reflectometry method.

A reflectometry system 101 according to the invention comprises an electronic component 111 of integrated circuit type, such as a programmable logic circuit, for example an FPGA, or microcontroller, adapted to execute two functions. On the one hand, the component 111 makes it possible to generate a reflectometry signal s(t) to be injected into the cable 104 being tested. This digitally generated signal is then converted via a digital-to-analog converter 112 then injected 102 at one end of the cable. The signal s(t) propagates through the cable and is reflected off the singularity created by the defect 105. The reflected signal is backpropagated as far as the point of injection 106 then captured 103, digitally converted via an analog-to-digital converter 113, and transmitted to the component 111. The electronic component 111 is furthermore adapted to execute the steps of the method according to the invention which will be described below in order, on the basis of the received signal s(t), to determine a reflectogram or several reflectograms.

The one or more reflectograms may be transmitted to a processing unit 114, such as a computer, personal digital assistant or otherwise, in order to display the results of the measurements on a human-machine interface.

Figure 1B:
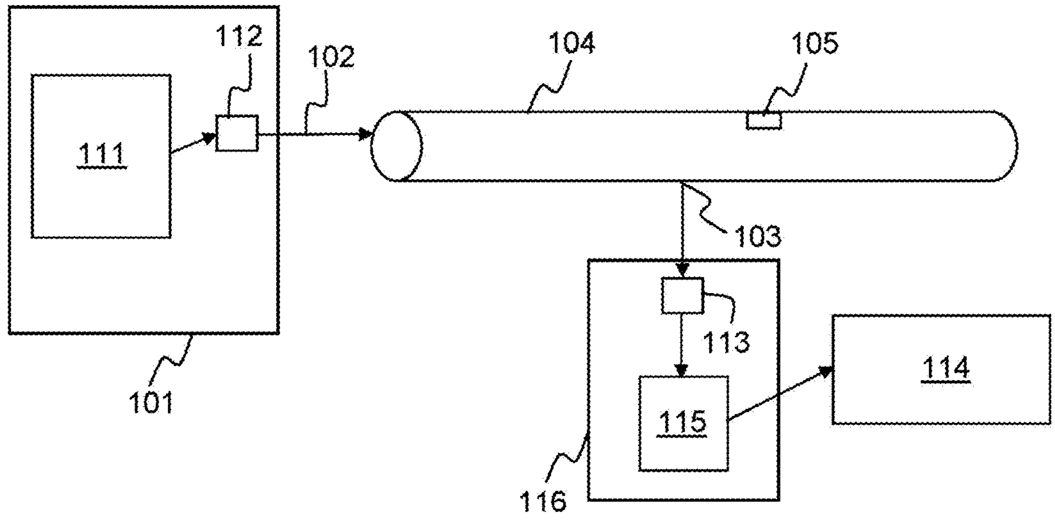
FIG. 1*b* depicts a diagram of a second example of a time-domain reflectometry system.

The system 101 described in FIG. 1*a* is one entirely non-limiting example of an embodiment. In particular, the two functions executed by the component 111 may be separated into two distinct devices or components as is illustrated in the example of FIG. 1*b*. The point of injection and the point of measurement of the signal may also be taken as any places on the cable and not as its end.

FIG. 1*b* depicts a first device 101 dedicated to generating the reflectometry signal and to injecting it into the cable and a second device 116 dedicated to measuring the signal at any point on the cable then to computing the reflectogram via a component 115.

The component 115 may be an electronic component of integrated circuit type, such as a programmable logic circuit, for example an FPGA or a microcontroller, for example a digital signal processor, which receives the signal measurements and is configured to execute the method according to the invention. The component 115 comprises at least one memory for saving the last samples of a signal which is generated and injected into the cable and the last samples of a signal which is measured.

As is known in the field of time-domain reflectometry diagnostic methods, the position $d_{DF}$ of a defect 105 on the cable 104, in other words the distance between it and the point of injection of the signal, may be obtained directly on the basis of the measurement, in the computed time-domain reflectogram R(t), of the duration $t_{DF}$ between the first amplitude peak noted in the reflectogram and the amplitude peak corresponding to the signature of the defect.

Figure 2:
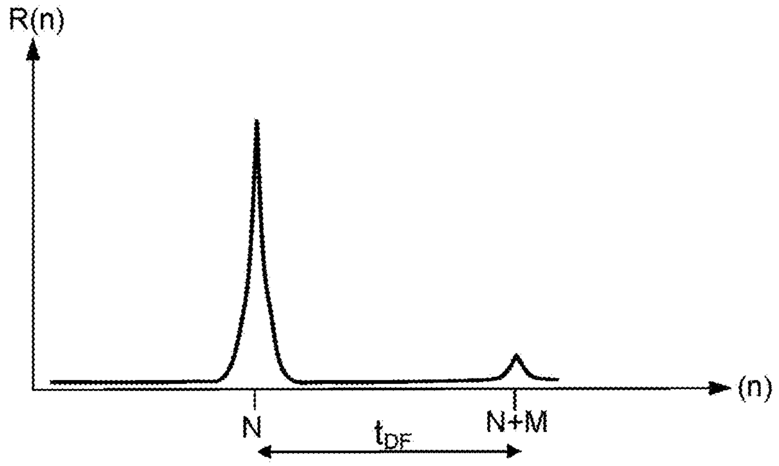
FIG. 2 depicts one example of a reflectogram obtained with the reflectometry system of FIG. 1*a* or 1*b* for a single cable.

FIG. 2 depicts one example of a reflectogram R(n) obtained using the system of FIG. 1*a* or 1*b*, in which a first amplitude peak at an x-axis coordinate N and a second amplitude peak at an x-axis coordinate N+M are observed. The first amplitude peak corresponds to the reflection of the signal at the point of injection into the cable, while the second peak corresponds to the reflection of the signal off an impedance discontinuity caused by a defect.

Various known methods may be envisaged for determining the position $d_{DF}$. A first method consists in applying the relationship linking distance and time: $d_{DF}=V_g \cdot t_{DF}/2$, where $V_g$ is the speed at which the signal propagates through the cable. Another possible method consists in applying a proportionality relationship such as $d_{DF}/t_{DF}=L_c/t_0$, where $L_c$ is the length of the cable and $t_0$ is the duration, measured in the reflectogram, between the amplitude peak corresponding to the impedance discontinuity at the point of injection and the amplitude peak corresponding to the reflection of the signal off the end of the cable.

Figure 3:
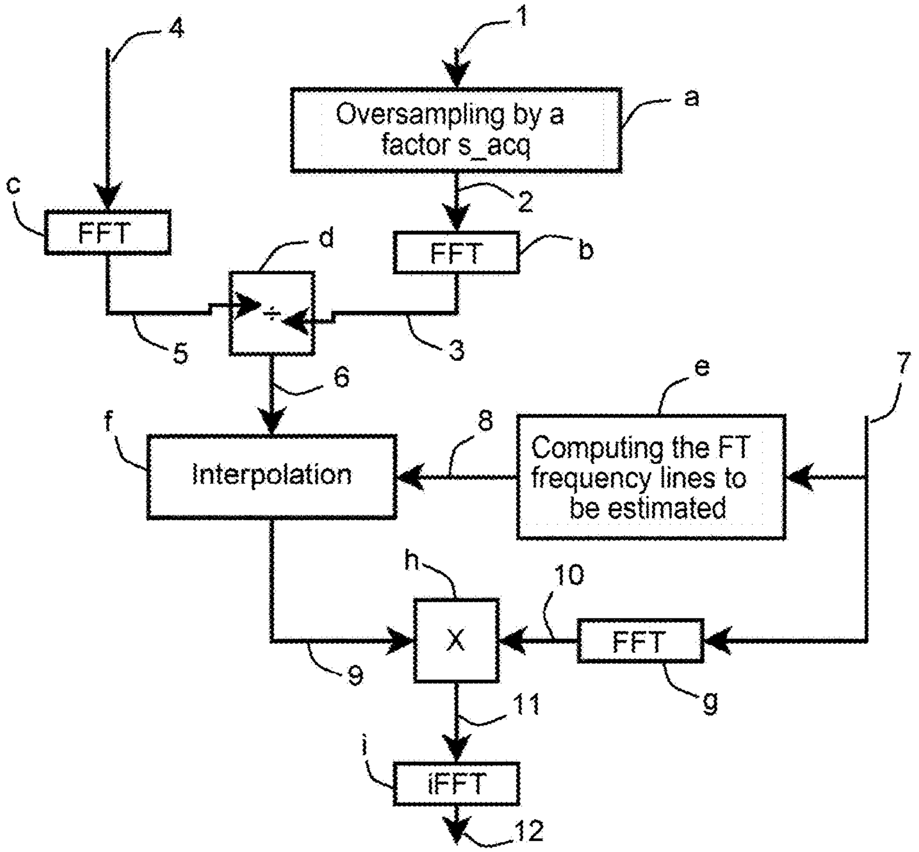
FIG. 3 depicts a flowchart detailing the steps for implementing a time-domain reflectometry method according to a first embodiment of the invention.

FIG. 3 schematically depicts a flowchart of the steps for implementing a method for analyzing defects by means of reflectometry according to a first embodiment of the invention. The method of FIG. 3 is executed by the component 111, 115 dedicated to computing the reflectogram.

The invention aims to carry out reflectometry measurements on the basis of a periodic time signal injected into the cable to be tested by means of a digital-to-analog converter CNA with a predefined sampling frequency $F_{cna}$.

Simultaneously, the device according to the invention measures the response of the cable subjected to the injected signal. This measurement is carried out by means of an analog-to-digital converter CAN with a sampling frequency $F_{can}$.

In other words, with reference to FIGS. 1*a* and 1*b*, the signal is injected into the cable in 102 via the digital-to-analog converter CNA 112 and is measured in 103 via the analog-to-digital converter CAN 113.

The method described in FIG. 3 receives as input, on the one hand, a copy of the test digital signal 1 which was injected into the cable and, on the other hand, a measurement 4 of the backpropagated signal. The test signal 1 is a periodic signal, for example a periodic pulsed signal, that is to say that a time pulse of duration Timp is repeated periodically with a period Pimp.

Optionally, the measurement signal 4 is oversampled by a factor $$s_{acq} = \frac{Facq}{Fcna}$$

in order to obtain a signal sampled at a higher frequency $F_{acq}$.

The oversampling may be carried out by means of any technique known from the prior art, for example:

by directly using an analog-to-digital converter operating at a high sampling frequency $F_{acq}$, by combining several acquisitions at sampling frequencies which are smaller but with additional time phase shifts. For K acquisition phases, the frequency of the analog-to-digital converter is equal to $$Fadc = \frac{Facq}{K}.$$

By interleaving the K phases a complete measurement sampled at the frequency $F_{acq}$ is obtained, by using the technique described in the patent application of the applicant FR1755478 or FR2926141.

The measured signal 4 at the sampling frequency $F_{acq}$ is then converted into the frequency domain by means of a discrete Fourier transform (step c), which is possibly implemented by a fast Fourier transform.

The copy 1 of the injected digital signal is also oversampled in order to obtain a digital signal 2 at the same sampling frequency $F_{acq}$ as the measured signal 4. The oversampling step a may be carried out by means of a sample-and-hold device.

The signal 2 at the output of step a is then converted into the frequency domain in step b by means of a discrete Fourier transform. The discrete Fourier transforms b and c have the same size, in other words the same number of frequency samples.

The outputs of steps b and c correspond to the frequency signals 3 and 5, which are the denominator and the numerator of the transfer function of the system being tested, respectively.

In step d, the ratio between the measured signal 5 and the test signal 3 in the frequency domain is computed. The division of step d is carried out sample by sample, which is possible since the two signals have the same size.

At the output of step d, the signal 6, which is a first estimate of the transfer function of the cable being tested at the sampling frequency $F_{acq}$, is obtained. The signal 6 is a discrete and complex digital signal.

One objective of the invention is to obtain a reflectogram having a level of accuracy corresponding to what would have been obtained with a signal 1 which had been injected into the cable at a higher sampling frequency. Recall that it is not desirable to increase the sampling frequency of the digital-to-analog converter because of the intrinsic limitations of this component.

For this purpose, one objective is to oversample the transfer function 6.

A signal 7 of the same nature as the test signal 1 but at a sampling frequency which is higher than the sampling frequency $F_{cna}$ is then generated. In addition, the signal 7 is a periodic pulsed signal, unlike the signal 1, which is a periodic but not necessarily pulsed signal. For example, the signal 7 is a pulsed periodic signal the pulse of which has a duration which is shorter than that of the test signal 1 which was injected into the cable and with the same period as the test signal 1.

In step e, the frequency lines which are contained in the signal 7 are then determined, in the form of a list of frequencies 8. Step e may be carried out by determining the inverse of the period of the signal, the frequency lines being multiples of this frequency. The extreme values of the list of frequencies 8 must be contained in the frequency definition range of the signal 6; if this is not the case, it is that the sampling frequency of the signal 7 was too high. It is then necessary either to decrease the sampling frequency of the signal 7 or to increase the oversampling factor s_acq used to obtain the signals 4 and 2. Advantageously, the idea is to choose a high oversampling factor $s_{acq}$, combined with a pulsed signal 7 having frequency lines which are as high as possible in frequency without exceeding the limits which result from the choice made for $s_{acq}$ in the frequency band of the signal 6.

Then, in step f, the estimated transfer function 6 is interpolated with the frequencies given by the list of frequencies 8. The interpolation is carried out in a complex plane and consists of a double interpolation on the modulus and on the phase, respectively. The separate interpolations on the modulus and on the phase may each be carried out by means of a linear or barycentric interpolation, for example.

An oversampled transfer function 9 is then obtained for all the frequencies which are present in the oversampled signal 7.

The oversampled signal 7 is converted into the frequency domain by means of a discrete Fourier transform g of a size which is compatible with that of the signal 9.

Then, in step h, a complex product is carried out sample by sample between the signal 9 and the signal 10 at the output of the FFT module g. A signal 11 which is a frequency version of the response of the cable being tested to the injection of the oversampled signal 7 is then obtained. Finally, an inverse discrete Fourier transform i is carried out in order to obtain the time signal 12 corresponding to the measurement which would be obtained by injecting the oversampled signal 7 into the cable.

Thus, the described method makes it possible to obtain a measurement by means of reflectometry which is equivalent to that which would be obtained with an oversampled injected signal but without increasing the sampling frequency of the digital-to-analog converter.

Figure 4:
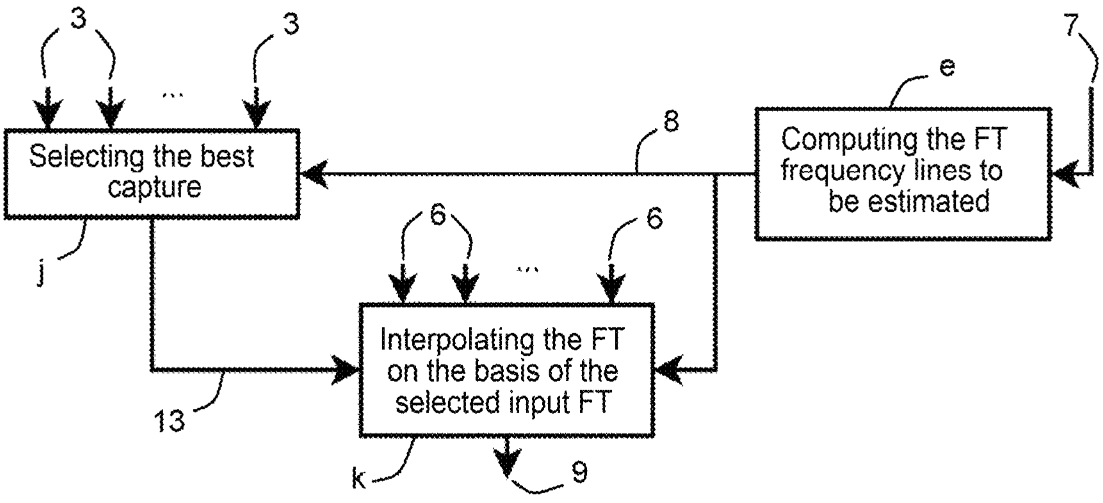
FIG. 4 depicts a second embodiment of the method according to the invention.

FIG. 4 schematically depicts a second embodiment of the invention, in which several measurements 4 of the back-propagated signal are carried out at various sampling frequencies. For each measurement 4 at a given sampling frequency, the test signal 1 is oversampled via step a at the same sampling frequency.

Several estimates 6 of the transfer function of the cable are then obtained at the output of the divider d for the various sampling frequencies.

The interpolation f of FIG. 3 is then carried out in two substeps.

In a first substep j, the injected signal 3 converted into the frequency domain the modulus of which is highest at the frequency under consideration is sought for each frequency of the list of frequencies to be interpolated 8, using, if necessary, an interpolation of the input signals 3. In a second substep k, the interpolation with the selected frequency is carried out on the estimate 6 selected in step j.

The result 9 at the output of the interpolation k consists of a frequency concatenation of the various measurements 6 which are interpolated with the frequencies of the list 8.

One advantage of this second variant is that it makes it possible to improve the result of the interpolation, notably in the regions of the spectrum containing a signal which is too weak and subjected to various noise sources, notably to the quantization noise which is intrinsic to the analog-to-digital converter. In particular, the injected signal is very weak in proximity to the multiples of the sampling frequency of the digital-to-analog converter, since the injected signal seen in the frequency domain is contained in a sinc function envelope which has the distinctive feature of becoming null at these specific frequencies.

The sampling frequencies of the signals 4 are chosen so that their multiples in the frequency range [0 Facq] are never identical and so that the minimum distance between any pair of multiples is as high as possible. For example, by choosing Fdac1=95.237 MHz and Fdac2=90.908 MHz, the following combinations of null points are obtained:

| Fdac1 = 95.237 MHz | Fdac2 = 90.908 MHz |
|---|---|
| 95.237 MHz | 90.908 MHz |
| 190.474 MHz | 181.816 MHz |
| 285.711 MHz | 272.725 MHz |
| 380.949 MHz | 363.633 MHz |
| 476.186 MHz | 454.541 MHz |
| 571.423 MHz | 545.449 MHz |
| 666.660 MHz | 636.357 MHz |
| 761.897 MHz | 727.265 MHz |
| 857.134 MHz | 818.174 MHz |
| 952.371 MHz | 909.082 MHz |
| 1047.609 MHz | 999.990 MHz |
| 1142.846 MHz | 1090.898 MHz |
| 1238.083 MHz | 1181.806 MHz |
| 1333.320 MHz | 1272.715 MHz |
| 1428.557 MHz | 1363.623 MHz |
| 1523.794 MHz | 1454.531 MHz |
| | 1545.439 MHz |

The closest frequencies which may be found between these two sets are: 95.237 MHz and 90.908 MHz, which are 4.329 MHz apart.

The method according to the invention may be implemented on the component 111, 115 on the basis of hardware and/or software elements.

The method according to the invention may be implemented directly by an embedded processor or in a specific device. The processor may be a generic processor, a specific processor, an application-specific integrated circuit (ASIC) or a field-programmable gate array (FPGA). The device according to the invention may use one or more dedicated electronic circuits or a general-purpose circuit. The technique of the invention may be carried out on a reprogrammable computing machine (a processor or a microcontroller, for example) executing a program comprising a sequence of instructions, or on a dedicated computing machine (for example, a set of logic gates such as an FPGA or an ASIC, or any other hardware module).

The invention claimed is:

1. A method for analyzing faults by means of reflectometry in a network of transmission lines into which a first test signal is injected beforehand, the method comprising the steps of:

measuring, with a measurement device, the first test signal after it has propagated through the network of lines, digitizing, with an analog-to-digital converter, the signal measured at a first sampling frequency, executing with a processor the steps of:

sampling the first test signal at the first sampling frequency, converting the digitized measured signal and the sampled first test signal into the frequency domain, determining an estimate of a transfer function of the network by computing a ratio between said signals in the frequency domain, generating a second test signal having a second sampling frequency, determining frequencies which are present in the second test signal, interpolating the estimated transfer function for the frequencies which are present in the second test signal, converting the second test signal into the frequency domain, computing a product of the interpolated transfer function and of the second test signal in the frequency domain, determining an estimate of a measurement of the second test signal after it has propagated through the network of lines by converting a result of said product into a time domain, and detecting a fault in the network of transmission lines from the estimate of a measurement of the second test signal.

2. The method for analyzing defects faults by means of reflectometry of claim 1, wherein the first test signal and the second test signal are periodic signals.

3. The method for analyzing faults by means of reflectometry of claim 2, wherein the second test signal is composed of a periodically repeated time pulse having a pulse duration which is smaller than the sampling frequency of the first test signal.

4. The method for analyzing faults by means of reflectometry of claim 1, wherein the measurement of the first test signal is digitized by means of an analog-to-digital converter operating at a sampling frequency which is smaller than the first sampling frequency, the digitized signal at the output of the analog-to-digital converter being oversampled at the first sampling frequency.

5. The method for analyzing faults by means of reflectometry of claim 4, wherein the first test signal is injected into said network of transmission lines with a sampling frequency which is smaller than the first sampling frequency and the method comprises a step of oversampling (a) the first test signal at the first sampling frequency.

6. The method for analyzing faults by means of reflectometry of claim 1, wherein the sampling, the converting, and the determining steps are iterated for several test signals at various sampling frequencies and the step of interpolating the transfer function is carried out by selecting, for each frequency to be interpolated, one of the test signals according to a predetermined criterion.

7. The method for analyzing faults of claim 6, wherein the predetermined criterion consists in selecting the test signal which has the highest amplitude for the frequency to be interpolated.

8. The method for analyzing faults of claim 1, wherein the interpolation step is carried out by means of a linear interpolation, on a modulus and on a phase of the signal separately.

9. A device for analyzing faults by means of reflectometry in a network of transmission lines into which a first test signal is injected beforehand, the device comprising a measuring device and a computing unit which are configured to implement the steps of the method of claim 1.

10. The device of claim 9, furthermore comprising a module for injecting the first test signal into the network of cables comprising a digital-to-analog converter, the measuring device comprising an analog-to-digital converter.

11. The method of claim 1 further comprising:

computing a reflectogram from the estimate of a measurement of the second test signal, and detecting a fault in the network of transmission lines from the reflectogram.

12. The method of claim 1, wherein acquiring the measurement comprises receiving, via an analog-to-digital converter, a reflected electrical signal resulting from propagation of the first test signal through a physical transmission line exhibiting at least one discontinuity.

13. The method of claim 1, wherein generating the second test signal comprises synthesizing, using a digital processing component, a digital waveform configured to emulate a signal having a sampling resolution exceeding a sampling frequency of a digital-to-analog converter used to inject the first test signal.

14. The method of claim 1, further comprising injecting the first test signal into the network of transmission lines via a digital-to-analog converter operating at a fixed sampling frequency.

15. The method of claim 1, wherein determining the estimate of the measurement of the second test signal produces a reflectometry measurement having a temporal resolution finer than a resolution achievable using the first test signal injected into the network of transmission lines.

16. The method of claim 15, wherein the finer temporal resolution corresponds to an improved spatial localization accuracy of a defect along the transmission line based on a reflectogram peak separation.

17. The method of claim 1, wherein interpolating the estimated transfer function enables reconstruction of signal components at frequencies not directly measurable due to sampling frequency limitations of the analog-to-digital converter.

18. The method of claim 1, wherein the first test signal and the second test signal propagate through the transmission line and are modified according to attenuation and dispersion properties of the transmission line prior to measurement.

19. The method of claim 1, wherein detecting the fault comprises identifying at least one peak in a reflectogram corresponding to a reflection caused by a physical defect in the transmission line.

20. The method of claim 1, wherein at least the converting, the determining the estimate of the transfer function, the interpolating, and the converting into the time domain steps are performed sequentially by a processor to generate a synthetic measurement corresponding to a signal not physically injected into the transmission line.

* * * * *